(12) United States Patent
Nakamura et al.

(10) Patent No.: US 6,252,376 B1
(45) Date of Patent: Jun. 26, 2001

(54) BATTERY-STATE MONITORING SYSTEM FOR A BATTERY GROUP

(75) Inventors: Hideji Nakamura; Kiyoshi Ueda, both of Kyoto (JP)

(73) Assignee: Japan Storage Battery Co., Ltd., Kyoto (JP)

( * ) Notice: Subject to any disclaimer, the term of this patent is extended or adjusted under 35 U.S.C. 154(b) by 0 days.

(21) Appl. No.: 09/268,655

(22) Filed: Mar. 16, 1999

(30) Foreign Application Priority Data

Mar. 17, 1998 (JP) .................................................. 10-067008

(51) Int. Cl.[7] .............................. H02J 7/00; G01N 27/416

(52) U.S. Cl. ........................................... 320/132; 324/429

(58) Field of Search ...................................... 320/132, 136; 324/426

(56) References Cited

U.S. PATENT DOCUMENTS 5,422,558 * 6/1995 Stewart ................................. 320/120
5,850,351 * 12/1998 Lofty et al. .......................... 364/492

* cited by examiner

*Primary Examiner*—Peter S. Wong
*Assistant Examiner*—Gregory J. Toatley, Jr.
(74) *Attorney, Agent, or Firm*—Sughrue, Mion, Zinn, Macpeak & Seas, PLLC

(57) ABSTRACT

A plurality of battery modules are provided for each module monitoring unit. When a battery module is normal, a photo-FET of a photocoupler contained in a module monitoring unit 5 associated with the battery module is turned on. When it is abnormal, the photo-FET is turned off. Those photo-FETs, provided in association with the battery modules, are connected in series by two signal lines. A management unit detects whether the circuit including those signal lines is opened or closed, and finds an abnormal battery module on the basis of the detection.

8 Claims, 4 Drawing Sheets

BATTERY-STATE MONITORING SYSTEM FOR A BATTERY GROUP

BACKGROUND OF THE INVENTION

1. Field of the Invention

The present invention relates to a battery-state monitoring system for monitoring the states of battery modules, which is adaptable for a battery system using a battery group having a plurality of battery modules.

2. Description of the Related Art

There is known a battery system using a battery group which consists of a plurality of battery modules connected in series or parallel fashion. An example of the battery system is a battery system for an electric vehicle. It is feared that a reliability of the system is deteriorated when the battery capacities, voltages and temperatures of the battery modules vary in their values. As a result, it is necessary to detect the current states of each battery module on its capacity, voltages and temperature, and to check whether or not the states of the battery modules are correct. Thus, a battery-state monitoring system is used for monitoring the current states of the battery modules.

In an example of the battery-state monitoring system, sensors are respectively provided for the battery modules to detect the current states of those modules, and are electrically connected to a management unit by signal lines. The management unit processes signals received from the sensors, and checks whether or not the current states of the battery modules are correct.

In the thus constructed battery-state monitoring system, a number of sensors are provided while being respectively associated with the battery modules, and connected to the management unit via signal lines. Therefore, a great number of the signal lines are required for their connection, and the wiring of the system is complicated. The wiring complexity leads to deterioration of the system reliability.

On the other hand, the system for monitoring battery states may be arranged such that battery-state monitoring units are respectively provided for the battery modules, and those units are connected to a management unit by two signal lines. In the battery-state monitoring system, communication on the units, are performed between the battery-state monitoring units and the management unit by use of a specific communication protocol. This monitoring system indeed succeeds in considerably simplifying the system wiring; however, it presents another problem. A control for controlling the data communication between the battery-state monitoring units and the management unit is indispensable to the monitoring system. The communication control is comparable with a LAN, and very complicated.

SUMMARY OF THE INVENTION

It is an object of the present invention is to provide a battery-state monitoring system for a battery group which simplifies the wiring of the system and a communication control arrangement.

A battery-state monitoring system for a battery group according to the present invention, comprises: a plurality of module monitoring units each comprising battery-state detecting means for detecting at least one state of each of plural battery modules forming a battery group; a switching element which turns on when the state of the battery module, detected by the battery-state detecting means, is a predetermined state, and turns off when the state is a state different from the predetermined state; and current detecting means connected in series or parallel to the switching element; two signal lines connecting the switching elements of the plurality of module monitoring units in series; and a management unit comprising first means for supplying alternate current to the two signal lines; and second means for detecting as to whether the circuit including the two signal lines is opened or closed, the management unit judging the states of the plurality of battery modules by the result of the detecting operation by the second means.

With such an arrangement, when the battery modules are all put in a normal state, the switching elements contained in all the module monitoring units are turned off. Therefore, the management unit detects that the circuit including the two signal lines is closed, and judges that all the battery modules are normal, from the detection result. When at least one battery module is not in the predetermined state, the switching element of at least one module monitoring unit is turned off. Therefore, the management unit detects that the circuit including the two signal lines is opened, and judges that at least one battery module is abnormal, from the detection result.

In the arrangement of the battery-state monitoring system, only two signal lines are used for connecting a plurality of module monitoring units to the management unit. The wiring of the system is simplified. Further, the battery-state monitoring system thus arranged can monitor the states of the battery modules in the following simple manner: each module monitoring unit turns on or off the phototransistor of the photocoupler contained therein in accordance with the states of the battery module 1 associated therewith, and the management unit detects that the circuit including the signal lines is closed or opened. This technical feature simplifies the communication control arrangement.

The battery-state monitoring system arranged as described above may further include mode select means for selecting a sleep mode to reduce power consumption by making invalid most of the functions of the module monitoring unit, or a normal mode to allow the module monitoring units to normally operate. The mode select means changes the operation mode of the module monitoring unit from the sleep mode to the normal mode in response to a start-up signal from the management unit. In the battery-state monitoring system, the switching element may be of the normal-on type, and hence it is turned on when receiving no control signal, and turned off when receiving a control signal.

In the battery-state monitoring system, the module monitoring units may time sequentially turn on or off the switching elements at predetermined time intervals in accordance with states representative of a plurality of characteristics of each battery module.

As seen from the foregoing description, the battery-state monitoring system for a battery group includes a plurality of module monitoring units each including a switching element which turns on when the state of the battery module is a predetermined state, and turns off when the state is a state different from the predetermined state, two signal lines connecting the switching elements of the plurality of module monitoring units in series; and a management unit for judging the states of the plurality of battery modules by the result of detecting as to whether the circuit including the two signal lines is opened or closed. Therefore, the battery-state monitoring system succeeds in simplifying the wiring of the system and a communication control arrangement.

PREFERRED EMBODIMENTS OF THE INVENTION

Preferred embodiments according to the present invention will be described as follows referring to the accompanying drawings.

<First Embodiment>

Figure 1:
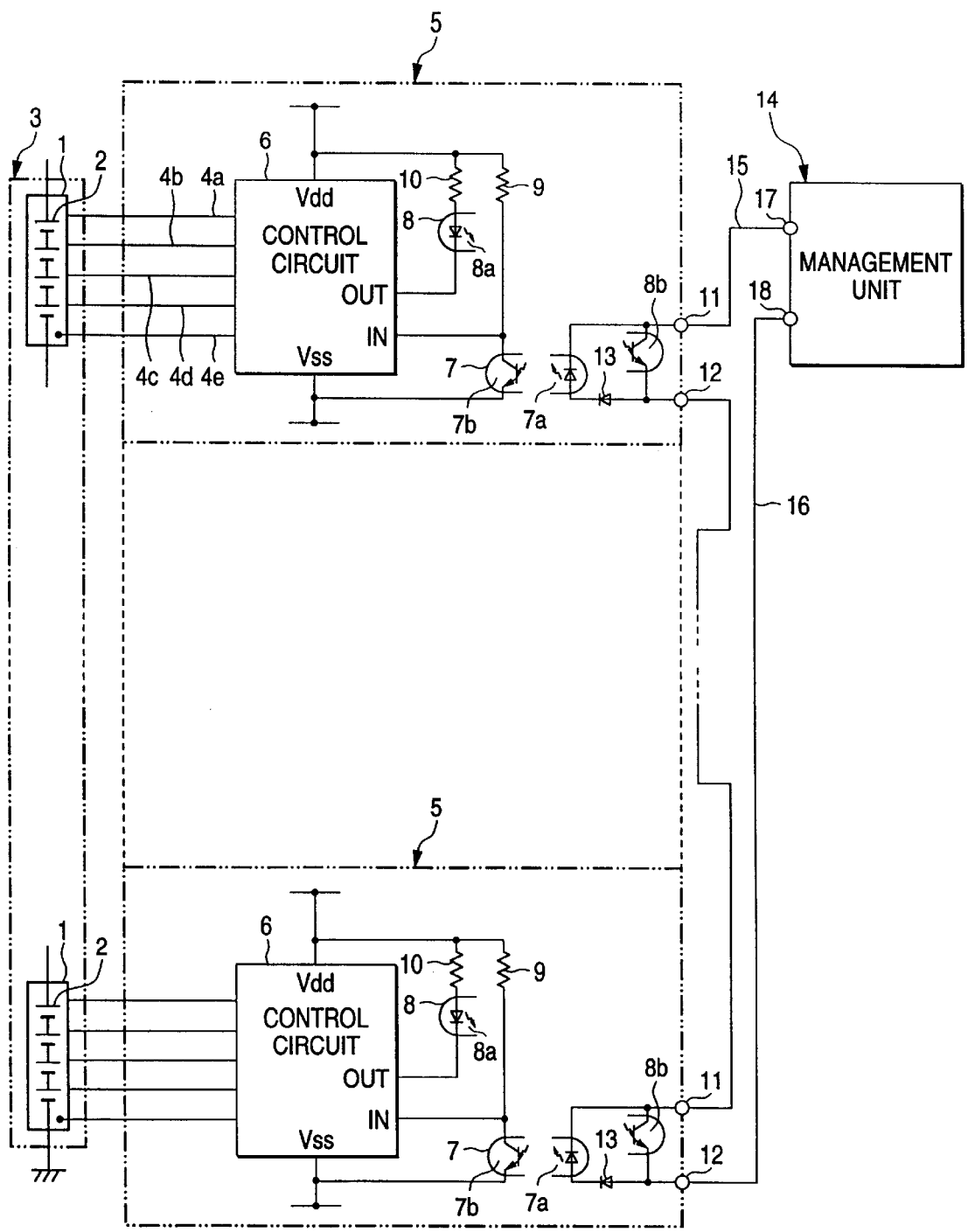
FIG. 1 is a circuit diagram showing an overall arrangement of a battery-state monitoring system for a battery group, which is a first embodiment of the present invention.

A first embodiment of the present invention will be described with reference to FIGS. 1 through 3. FIG. 1 is a circuit diagram showing an overall arrangement of a battery-state monitoring system for a battery group. In FIG. 1, a battery module 1 having, for example, four cells 2 connected in series. Each cell is a lithium ion secondary cell, for example. An m (m : integer of 2 or larger) number of battery modules thus constructed are connected in series or in parallel to form a battery group 3.

Voltage signals of the four cells 2 of each battery module 1 are connected, through four signal lines 4a to 4d, to a control circuit 6, which in turn detects voltage of each cell. Temperature of each battery module 1 is detected by a temperature sensor (not shown), and a signal indicative of the detected temperature is output from the sensor to the control circuit 6, by way of a signal line 4e.

The detected voltage signals of the battery cells 2 in each battery module 1 and the detected temperature signal of the battery module 1 are applied to a module monitoring unit 5, which is provided in association with the battery module 1. As shown, the module monitoring units 5 are respectively provided for the battery modules 1. Each module monitoring unit 5, provided for monitoring the states of the battery module 1 associated therewith, includes the control circuit 6 including a microprocessor and a couple of photocouplers 7 and 8.

The control circuit 6 of each battery module 1, which is connected to the signal lines 4a to 4e derived from the battery module, performs comparing operations on the voltage signals output from the battery cells 2 of the battery module and on the temperature signal from the battery module 1. Based on these results, it lights on or off an LED 8a of the photocoupler 8 in accordance with a signal representative of each comparison result. A series circuit having a resistor 9 and a phototransistor 7b of the photocoupler 7 is inserted between a DC constant voltage terminal Vdd and a ground terminal Vss. A node between the resistor 9 and the phototransistor 7b of the photocoupler 7 is connected to an input terminal in of the control circuit 6.

In this case, the control circuit 6 judges whether the phototransistor 7b is turned on or off, namely, the LED 7a of the photocoupler 7 is lit on or off, by the voltage applied to its input terminal in. Specifically, when the voltage applied to the input terminal in is at a low level (equal to a level at the ground terminal Vss), the control circuit 6 judges that the LED 7a of the photocoupler 7 emits light. When it is at a high level (equal to a level at the DC constant voltage terminal Vdd), the control circuit 6 judges that the LED 7a does not emit light. A constant voltage circuit (not shown), which produces a constant voltage at a predetermined level when it receives a voltage from the battery module 1, applies a constant voltage to the DC constant voltage terminal Vdd of the control circuit.

A series circuit having a resistor 10 and the LED 8a of the photocoupler 8 is connected between the DC constant voltage terminal Vdd and an output terminal out of the control circuit 6. In this case, the control circuit 6 lights on or off the LED 8a, or turns on or off a phototransistor 8b of the photocoupler 8, by switching a voltage level at the output terminal out to another voltage level. Specifically, the control circuit 6 turns on the phototransistor 8b of the photocoupler 8 by pulsing a voltage level at the output terminal out to a low level (equal to the level at the ground terminal Vss), and turns off the same by raising the voltage level to a high level (equal to the level at the DC constant voltage terminal Vdd). In the present embodiment, the phototransistor 8b of the photocoupler 8 constitutes a switching element.

The phototransistor 8b of the photocoupler 8 and the LED 7a of the photocoupler 7 are connected in parallel between external terminals 11 and 12 of the module monitoring unit. A diode 13, while being directed as shown, is connected between the LED 7a of the photocoupler 7 and the external terminal 12.

The m number of the thus arranged module monitoring units 5 are connected to a management unit 14 for managing the whole battery group 3, by way of two signal lines 15 and 16. More specifically, the first signal line 15 is divided into m lines. A first divided line interconnects the first external terminal 11 of the first module monitoring unit 5 and a first external terminal 17 of the management unit 14. A second divided line interconnects the second external terminal 12 of the first module monitoring unit 5 and the first external terminal 11 of the second module monitoring unit 5. A third and subsequent divided lines interconnect the external terminals of the related module monitoring units in similar ways. An m-th divided line interconnects the second external terminal 12 of the (m–1)th module monitoring unit 5 and the first external terminal 11 of the m-th module monitoring unit 5. The second signal line 16 interconnects the second external terminal 12 of the m-th module monitoring unit 5 and a second external terminal 18 of the management unit 14.

Since the m number of module monitoring units 5 and the signal line 15 are thus wired, the phototransistors 8b of those module monitoring units 5 are connected in series by the two signal lines 15 and 16. In other words, the m number of phototransistors 8b connected in series by the two signal lines 15 and 16, those signal lines 15 and 16, and the management unit 14 form a closed circuit. Similarly, the LEDs 7a of the photocoupler 7 and the diodes 13 are connected in series by the two signal lines 15 and 16, and hence the LEDs 7a, the diodes 13, the signal lines 15 and 16, and the management unit 14 form another closed circuit.

An electrical arrangement of the management unit 14 will be described with reference to FIG. 2. The management unit 14 having a control unit 19 including a microprocessor, four photocouplers 20 to 23 and two constant current sources 24 and 25.

Figure 2:
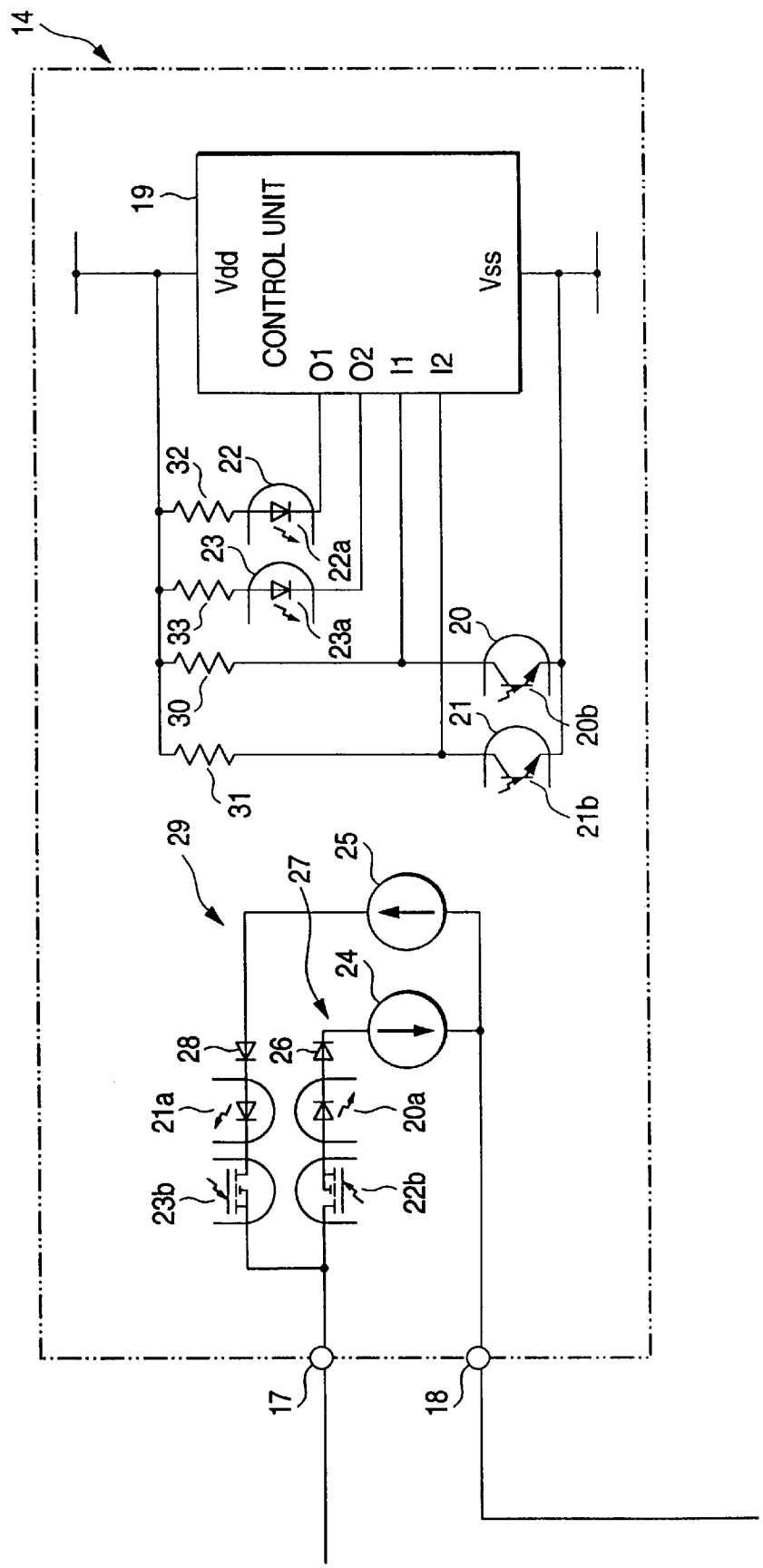
FIG. 2 is a circuit diagram showing a management unit in the battery-state monitoring system of FIG. 1.
Figure 3:
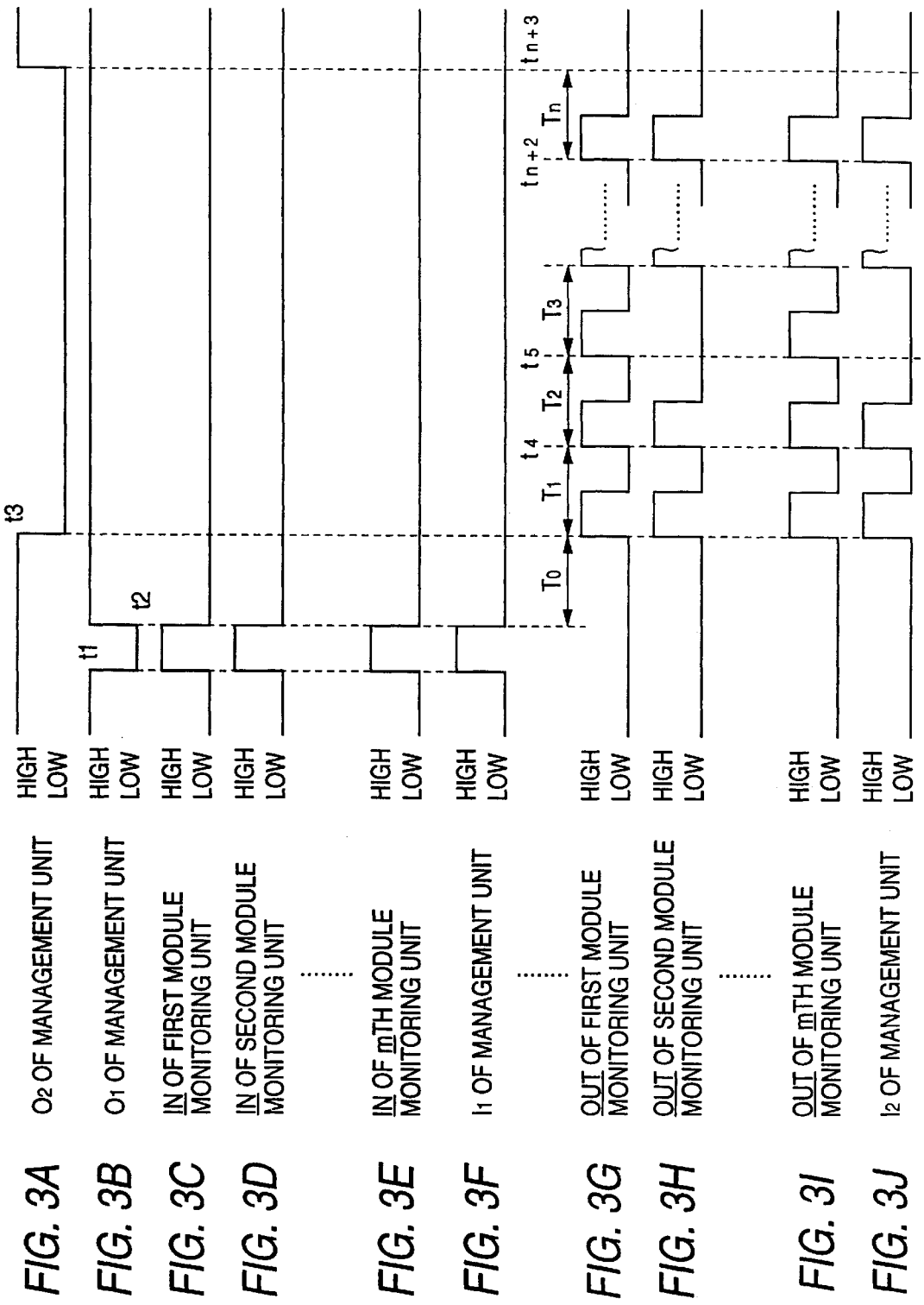
FIGS. 3A to 3J are timing charts showing an operation of the battery-state monitoring system.

To be more specific, a constant current source 24 for feeding a constant current in a direction of an arrow directed downward in FIG. 2, an LED 20a of a photocoupler 20, a photo-FET 22b of a photocoupler 22, and a diode 26 are connected in series to form a series circuit 27, which is connected between the first and second external terminals 17 and 18, as shown in FIG. 2. The series circuit 27 is connected in parallel to another series circuit 29, which includes a constant current source 25 for feeding a constant current in a direction of an arrow directed upward in FIG. 2, an LED 21a of a photocoupler 21, a photo-FET 23b of a photocoupler 23, and a diode 28, which are connected in series between the external terminals 17 and 18.

A series circuit including a resistor 30 and a phototransistor 20b of the photocoupler 20 is inserted between a DC constant voltage terminal Vdd and a ground terminal Vss. A node between the resistor 30 and the phototransistor 20b of the photocoupler 20 is coupled to an input terminal I1 of the control unit 19.

In this case, the control unit 19 judges whether the phototransistor 20b is in an on state or in an off state, or the LED 20a of the photocoupler 20 lights on or off, by a level of the voltage applied to the input terminal I1. Specifically, when the voltage applied to the input terminal I1 is at a low level (equal to a voltage level at the ground terminal Vss), the control unit 19 judges that the LED 20a of the photocoupler 20 is lit on. When it is at a high level (equal to a voltage level at the DC constant voltage terminal Vdd), the control unit 19 judges that the LED 20a is lit off. A constant voltage circuit (not shown), which receives voltage from one of the m number of battery modules 1 and generates a constant voltage at a predetermined level, applies the constant voltage to the DC constant voltage terminal Vdd.

A series circuit having a resistor 31 and a phototransistor 21b of the photocoupler 21 is connected between the DC constant voltage terminal Vdd and the ground terminal Vss. A node between the resistor 31 and the phototransistor 21b of the photocoupler 21 is connected to an input terminal I2.

In this case, the control unit 19 judges whether the phototransistor 21b is in an on state or an off state, or the LED 20a of the photocoupler 20 is lit on or off, by the voltage applied to the input terminal I2. More specifically, when the voltage applied to the input terminal I2 is at a low level, the control unit 19 judges that the LED 21a of the photocoupler 21 emits light. When it is at a high level, the control unit 19 judges that the LED 21a emits no light.

A series circuit having a resistor 32 and an LED 22a of the photocoupler 22 is inserted between the DC constant voltage terminal Vdd and an output terminal O1 of the control unit 19. In this case, the control unit 19 lights on or off the LED 22a, or turns on or off the photo-FET 22b of the photocoupler 22, by switching a voltage level at the output terminal O1 to another voltage level. Specifically, the control unit 19 pulses a voltage level at the output terminal O1 to a low level to turn on the photo-FET 22b of the photocoupler 22, and the voltage level to a low level to turn off the photo-FET 22b.

A series circuit having a resistor 33 and an LED 23a of the photocoupler 23 is inserted between the DC constant voltage terminal Vdd and the output terminal O1 of the control unit 19. In this case, the control unit 19 lights on or off the LED 23a, or turns on or off the photo-FET 23b of the photocoupler 23, by pulsing a voltage level at an output terminal O2 to another level. Specifically, the control unit 19 switches a voltage level at the output terminal O2 to a low level to turn on the photo-FET 23b of the photocoupler 23, and the voltage level to a high level to turn off the photo-FET 23b.

An operation of the thus arranged battery-state monitoring system will be described with reference to FIGS. 1 and 2, and additionally FIGS. 3A to 3J showing time charts. In an initial stage, the control unit 19 of the management unit 14 sets the voltage levels at both the output terminals O1 and O2 at a high level. Therefore, the LEDs 22a and 23a of the photocouplers 22 and 23 are both lit off, namely, the photo-FETs 22b and 23b are both in an off state.

Also in the initial stage, in the control circuit 6 of each of the m number of module monitoring units 5, only a function of the control circuit to detect an on or off state of the phototransistor 7b of the photocoupler 7, viz., a level at its input terminal in, is valid, while other functions are invalid. In other words, in this stage, each control circuit is set in a sleep mode where it consumes an extremely small amount of electric power. Also in this stage, the output terminal out of the control circuit 6 is set at a high level, and hence the LED 8a of the photocoupler 8 is lit off and its phototransistor 8b is turned off.

At a time point t1, the control unit 19 of the management unit 14 changes a voltage level at the output terminal O1 to a low level (FIG. 3B). The low level state continues up to a time point t2, and this low level signal corresponds to a start-up signal. When the output terminal O1 is pulsed to a low level, the LED 22a of the photocoupler 22 is lit on and the photo-FET 22b thereof is turned on. In turn, in the m number of module monitoring units 5, the LEDs 7a of the photocouplers 7 are lit on and the phototransistors 7b thereof are turned on, and the input terminals in of the control circuits 6 are pulsed to a high level (FIGS. 3C to 3E).

As a result, each control circuit 6 recognizes that it receives the start-up signal from the management unit 14, and changes its operation mode from a sleep mode to a normal mode. Under this condition, all the functions of each control circuit 6 are valid. In this case, the control circuit 6 functions as mode select means.

In the management unit 14, when the output terminal O1 is pulsed to a low level, the LED 20a of the photocoupler 20 emits light and its phototransistor 20b is turned on. In turn, the input terminal I1 of the control unit 19 in the management unit 14 goes high (FIG. 3F). The control unit 19 is arranged such that when recognizing that the input terminal I1 goes high, it judges that the two signal lines 15 and 16 are normal and the LED 7a of the photocoupler 7 of each module monitoring unit 5 normally operates (in other words, no disconnection is present in those signal lines 15 and 16). The control unit 19 is designed such that at the time point t2, it sets the output terminal O1 at a high level (FIG. 3B), lights off the LED 22a of the photocoupler 22, and turns off the photo-FET 22b thereof.

A time duration from the time point t2 to a time point t3 is used as a predetermined stand-by time T0. A battery-state monitor control for monitoring the states of the m number of battery modules 1 starts at the time point t3. Specifically, at the time point t3, the control unit 19 of the management unit 14 sets the output terminal O2 thereof at a low level (FIG. 3A). This low level state continues up to a time point (i.e., tn+3) that the battery-state monitor control ends. When the output terminal O2 is pulsed to a low level, the LED 23a of the photocoupler 23 lights up, and the photo-FET 23b thereof is turned on.

Simultaneously with the battery-state monitor control, the control circuit 6 of each module monitoring unit 5 operates at the time point t3 in the following way. When detecting that a first state of the related battery module 1 is normal (e.g., the CMU is normal), the control circuit 6 changes a voltage level at its output terminal out to a low level, lights on the LED 8a of the photocoupler 8, and turns on the phototransistor 8*b* of the photocoupler. When detecting that the first state of the battery module 1 is abnormal, the control circuit 6 leaves the output terminal out high in level, the LED 8*a* of the photocoupler 8 unlighted or turned off, and the phototransistor 8*b* turned off.

When detecting that the first state of the related battery module 1 is normal, the control circuit 6 changes a voltage level at its output terminal out to a low level as shown in FIGS. 3G to 3I, and turns on the phototransistor 8*b* of the photocoupler. Then, in the management unit 14, the LED 21*a* of the photocoupler 21 emits light and the phototransistor 21*b* is turned on. The input terminal I2 of the control unit 19 in the management unit 14 goes high (FIG. 3J). Consequently, the control unit 19 recognizes that the input terminal I2 is at a high level, and judges that all the m number of battery modules are normal in their first state, by the recognition. In this case, the recognition of a low level at the input terminal I2, made by the control circuit 6, is equivalent to detection of the two signal lines 15 and 16 being closed, made by the same.

A time taken for sending the first state of each battery module to the management unit 14 ranges from the time point t3 to a time point t4. The first-state sending time, denoted as T1, is predetermined. A time for the control circuit 6 of the module monitoring unit 5 to retain a low level at the output terminal out is selected to be substantially the half of the state sending time T1; if required, it may be equal to the state sending time T1.

A time T2 from the time point t4 to a time point t5 is used for sending a query as to whether a second state of each battery module 1 is normal or abnormal (for example, a battery cell 2 producing an over-voltage is present or absent) to the management unit 14. A control process performed in this case is substantially the same as that performed when the first state is sent. When detecting that the second state of each battery module 1 is normal, the control circuit 6 in each module monitoring unit 5 switches a voltage level at the output terminal out to a low level, to thereby light the LED 8*a* of the photocoupler 8 and turn on the phototransistor 8*b* thereof.

If all the battery modules are normal in their second state (FIGS. 3G to 3I), the control circuits 6 in the m number of module monitoring units 5 switch a voltage level at their output terminals out to a low level, and turn on the phototransistors 8*b* of the photocouplers 8. Accordingly, in the management unit 14, the LED 21*a* of the photocoupler 21 emits light, the phototransistor 21*b* turns on, and the input terminal I2 of the control unit 19 in the management unit 14 is pulsed to a high level (FIG. 3J). Consequently, the control unit 19 recognizes that the input terminal I2 is at a high level, and judges that the m number of battery modules 1 are all normal in their second state. The time T2 for sending a second-state query is selected to be equal to the state sending time T1.

A time T3 from the time point t5 to a time point t6 is used for sending a query as to whether or not a third state of each battery module 1 is normal (for example, a battery cell 2 producing a lower voltage is present or absent) to the management unit 14. A control process performed in this case is substantially the same as that performed when the second state is sent. When detecting that the third state of each battery module 1 is normal, the control circuit 6 in each module monitoring unit 5 switches a voltage level at the output terminal out to a low level, to thereby light the LED 8*a* of the photocoupler 8 and turn on the phototransistor 8*b* thereof.

For example, a third state of the second battery module 1 is abnormal. In his supposed case, as shown in FIGS. 3G to 3I, the control circuit 6 of the second module monitoring unit 5 leaves its output terminal out high in level, and hence the phototransistor 8*b* of the photocoupler 8 remains turned off. Therefore, in the management unit 14, the LED 21*a* of the photocoupler 21 remains unlighted, the phototransistor 21*b* is turned off, and the input terminal 12 of the control unit 19 in the management unit 14 is pulsed to a low lever (FIG. 3J). The control unit 19 recognizes that the input terminal 12 goes low, and judges, by this recognition, that at least one of the m number of battery modules 1 is abnormal in its third state. In this case, the recognition of a low level at the input terminal 12, made by the control circuit 19, is equivalent to detection of the two signal lines 15 and 16 being closed.

In the embodiment, queries as to whether or not fourth to n-th states of each battery module 1 are normal (for example, the voltages produced are uniform in value or temperature of the battery module is normal) are sent to the management unit 14 as in the controls for sending three states of the battery module, already described. Sensor signals (representative of voltages of the battery cells 2 of the battery module 1 and temperature of the battery module) received through the signal lines 4*a* to 4*e* from the battery module 1 are used when the module monitoring unit 5 judges whether or not an n number of states of the battery module 1 are normal.

When the transmission control of the n-th state is completed, namely, at a time point tn+3, the control unit 19 in the management unit 14 changes a voltage level at its output terminal O2 to a low level (FIG. 3A). In turn, the LED 23*a* of the photocoupler 23 is unlighted, and the photo-FET 23*b* is turned off. At the same time (time point tn+3), the operation mode of the control circuits 6 of the m number of module monitoring units 5 are changed from the normal mode to the sleep mode. At this time, one cycle of the monitoring process for monitoring the respective states of them number of battery modules 1 is completed. Subsequently, the transmission control (i.e., battery state monitor control) which continues from t1 to tn+3 is repeatedly executed.

In the above described battery state monitor control, when the control unit 19 of the management unit 14 recognizes an abnormal state of at least one battery module 1, it informs the user of the abnormal state of the module in a proper way. Examples of the abnormal-state informing ways are to display the abnormal module state on a display (not shown), to sound a buzzer, and to light an LED provided only for the abnormal-state informing purpose.

The thus arranged battery-state monitoring system includes:

1) the m number of module monitoring units 5 each including a phototransistor 8*b*, which turns on when the characteristic of a battery module 1 associated therewith is in a predetermined state, and turns off when it is in any of other states other than the predetermined one, 2) signal lines 15 and 16 connecting the phototransistors 8*b* in series, and 3) the management unit 14 which detects that a circuit including the signal lines 15 and 16 is opened or closed, and then judges the states of the m number of battery modules 1 on the basis of the detection result. When the management unit 14 detects that the circuit of the signal lines 15 and 16 is closed, if the phototransistors 8*b* of all the module monitoring units 5 are turned on, the management unit 14 judges that the battery modules 1 are all normal. The states on a plurality of characteristics of all the battery modules 1 are transmitted in a time sequence of pulses to the management unit 14. Therefore, the management unit 14 grasps the states on the various characteristics of the battery modules.

When the management unit 14 detects that the circuit of the signal lines 15 and 16 is opened, if the phototransistor 8b of at least one module monitoring units 5 is turned off, the management unit 14 judges that at least one battery module 1 is abnormal. Further, in the embodiment, only two signal lines 15 and 16 are used for connecting the m number of module monitoring units 5 to the management unit 14. This feature leads to simplification of the wiring of the battery-state monitoring system.

The battery-state monitoring system of the embodiment can monitor the states of the battery modules in the following simple manner: 1) each module monitoring unit 5 turns on or off the phototransistor 8b of the photocoupler 8 contained therein in accordance with the states of the battery module 1 associated therewith, and 2) the management unit 14 detects that the circuit including the signal lines 15 and 16 is closed or opened, more precisely the LED 21a of the photocoupler 21 contained therein is turned on or off. This technical feature simplifies the communication control arrangement.

In the above embodiment, when the module monitoring unit 5 receives a start-up signal from the management unit 14 (specifically, the phototransistor 7b of the photocoupler 7 contained therein is turned on), the operation mode of the m number of module monitoring units 5 is changed from a sleep mode to a normal mode. This technical feature contributes to considerably reduce power consumption by the m number of module monitoring units 5.

In the battery-state monitoring system of the above-mentioned embodiment, to check whether or not the signal lines 15 and 16 are disconnected, the management unit 14 detects whether the phototransistor 20b of the photocoupler 20 contained therein is turned on or off when it sends a start-up signal to the m number of module monitoring units 5. This technical feature provides a reliable finding of disconnection of the signal lines 15 and 16. Further, when the circuit including the signal lines 15 and 16 is opened, it is reliably judged that at least one battery module 1 is abnormal.

In the embodiment, the module monitoring unit 5 detects whether or not the n number of states of the battery module 1 associated therewith are normal, and sends those detected n number of states in the order of detecting them to the management unit 14. With the technical feature, the battery-state monitoring system can readily monitor a great number of states of the battery module 1.

Further, in the embodiment, the m number of module monitoring units 5 change their operation mode from a sleep mode to a normal mode and vice versa. If necessary, the module monitoring units 5 may be designed so as to operate always in a normal mode. The above-mentioned embodiment uses the arrangement that the management unit 14 sends a start-up signal to the m number of module monitoring units 5. If required, the arrangement may be omitted. Where the arrangement is omitted, in a normal state where the battery modules 1 are normal, the phototransistors 8b of the photocouplers 8 are put in an on state. If any of the battery modules 1 is abnormal, the phototransistor 8b of the photocoupler 20 is turned off.

In the above-mentioned embodiment, when the n number of states of the battery module 1 are sequentially transmitted to the management unit 14, the low level state at the output terminal O2 of the control unit 19 in the management unit 14 lasts for a relatively long time (from t3 to tn+3). Alternatively, it may be equal to the time duration of the low level state at the output terminal out of the control circuit 6 of the module monitoring unit 5.

The lithium ion secondary cell is used for the battery cell in the above-mentioned embodiment. However, it may be substituted by a lead secondary battery, a nickel-cadmium secondary battery, or a nickel-hydrogen secondary battery. It is preferable that an abnormality indicating LED is used for each of the m number of module monitoring units 5, and is lit on when an abnormal battery module or modules are detected. If so designed, when the management unit 14 judges that at least one battery module is abnormal and informs the user of its abnormality, the user can easily find the faulty battery module from them number of battery modules 1.

<Second Embodiment>

Figure 4:
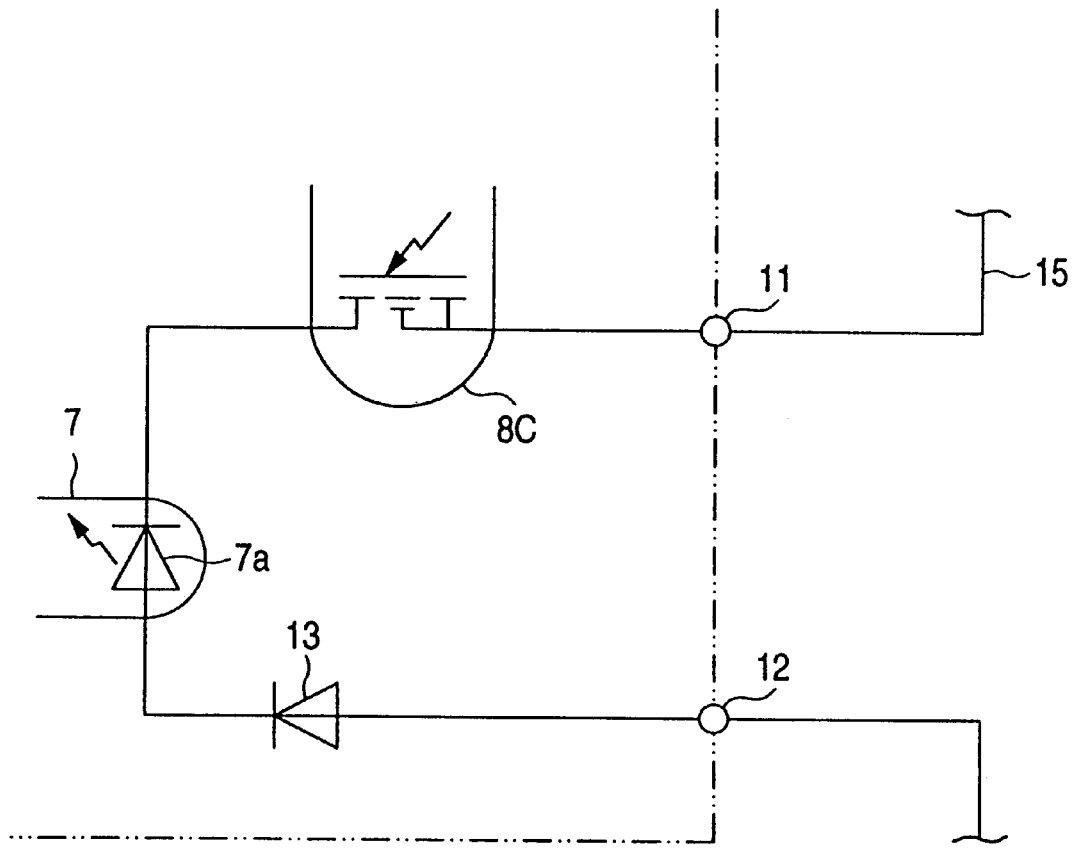
FIG. 4 is a circuit diagram showing an essential portion of a battery-state monitoring system which is a second embodiment of the invention.

FIG. 4 shows a portion of a battery-state monitoring system which is a second embodiment of the present invention. In the drawing, only a circuitry between the external terminals 11 and 12 of each module monitoring unit 5 is illustrated since the remaining portion of the system is substantially the same as of the battery-state monitoring system of the first embodiment.

The second embodiment uses a normal-on-type photo-FET 8c in place of the phototransistor 8b of the photocoupler 8. The photo-FET 8c is connected the external terminal 11 and the cathode of the LED 7a of the photocoupler 7. When the state of the battery module 1 is normal, the photo-FET 8c is turned on, and when the state of it is abnormal, the photo-FET 8c is turned off. Since the photo-FET 8c is of the normal-on type, a control signal is applied to the photo-FET 8c, from the control circuit 6 of the module monitoring unit 5 only when the photo-FET 8c is turned off. To turn on the photo-FET 8c, no control signal needs to be applied to the photo-FET 8c. Therefore, when the control circuit 6 in the module monitoring unit 5 is in sleep mode, the photo-FET 8c is in an on state.

In designing the second embodiment, the constant current source 25, the photocouplers 21 and 23, and the diode 28 are omitted. In the thus designed battery-state monitoring system, 1) the judgement about disconnection of the signal lines 15 and 16 and 2) the judgement as to whether or not an m number of photo-FETs 8c are all in an on state are both made through on/off of the phototransistor 20b of the photocoupler 20.

The remaining arrangement of the second embodiment is substantially the same as the corresponding one of the first embodiment. Therefore, the second embodiment can achieve the same useful effects as of the first embodiment. Since the constant current source 25, the photocouplers 21 and 23, and the diode 28 are not used in the second embodiment, the arrangement of the battery-state monitoring system is simplified. Further, the various modifications and alterations following the description of the first embodiment are preferably applied to the second embodiment.

In the embodiments mentioned above, the judgement as to whether or not the cell voltage is within a normal value of voltage is made. In an alternative, judgement is made to specify a graduation indicated by a voltage produced by each cell of the battery module 1 on a scale graduated in 0. 5 V steps, for example, which represents a normal range of voltage values. The LED 8a of the photocoupler 8 is turned on and off at predetermined time intervals in accordance with the result of the judgement, and the module monitoring unit 5 time sequentially produces a series of pulses representative of information on the cell voltages. The alternative can detect a variation of voltage values of the battery modules 1, and hence it is effective for detecting a cell-short trouble within the battery module.

What is claimed is:

1. A battery-state monitoring system for a battery group comprising:

a plurality of battery module monitoring units each comprising:

battery-state detecting means for detecting at least one state of each of plural battery modules forming a battery group;

a switching element which turns on when the state of said battery module, detected by said battery-state detecting means, is a predetermined state, and turns off when said state is a state different from said predetermined state; and current detecting means connected in series or parallel to said switching element;

two signal lines connecting said switching elements of said plurality of module monitoring units in series; and a management unit comprising first means for supplying pulse current to said two signal lines; and a second means for detecting as to whether the circuit including said two signal lines is opened or closed, said management unit judging the states of said plurality of battery modules by the result of the detecting operation by said second means.

2. A battery-state monitoring system for a battery group according to claim 1, wherein each said battery module monitoring unit is driven or selects a time to turn on or off said switching element by current, directed in a direction, fed from a pulse current source provided in said management unit, and sends the state of said battery module to said management unit by interrupting or allowing a flow of a current of which the direction is opposite to said direction by turning on or off said switching element.

3. The battery-state monitoring system for a battery group according to claim 1, wherein said plurality of battery module monitoring units receive a signal defined a sequence of current pulses of a direction, derived from said pulse current source provided in said management unit, said switching element of only said battery module monitoring unit specified by said signal defined by the sequence of current pulses is turned on or off, and said management unit communicates with said specified module monitoring unit by use of the current of which the direction is opposite to that of said sequence of current pulses.

4. The battery-state monitoring system for a battery group according to claim 1, wherein each said battery module monitoring unit further comprises comparing means for comparing a numerical value based on the state of said battery module detected by said battery-state detecting means with a predetermined numerical value, and a switching operation of said switching element is controlled on the basis of the result of the comparing operation by said comparing means.

5. The battery-state monitoring system for a battery group according to claim 1, further comprising mode select means for selecting a sleep mode to reduce power consumption by making invalid most of the functions of said battery module monitoring unit, or a normal mode to allow said battery module monitoring units to normally operate, said mode select means changing the operation mode of said battery module monitoring unit from the sleep mode to the normal mode in response to a start-up signal from said management unit.

6. The battery-state monitoring system for a battery group according to claim 1, wherein said switching element is of the normal-on type, and turned on when receiving no control signal, and turned off when receiving a control signal.

7. The battery-state monitoring system for a battery group according to claim 1, wherein said battery module monitoring units time sequentially turn on or off said switching elements at predetermined time intervals in accordance with states representative of a plurality of characteristics of each said battery module.

8. A battery-state monitoring system for a battery group comprising:

a plurality of battery module monitoring units each comprising:

battery-state detecting means for detecting at least one state of each of plural battery modules forming a battery group;

a switching element which turns on when the state of said battery module, detected by said battery-state detecting means, is a predetermined state, and turns off when said state is a state different from said predetermined state; and current detecting means connected in series or parallel to said switching element;

two signal lines connecting said switching elements of said plurality of module monitoring units in series; and a management unit comprising first means for supplying a pulse current directed in a direction and a pulse current directed in an opposite direction to said two signal lines; and a second means for detecting as to whether the circuit including said two signal lines is opened or closed, said management unit judging the states of said plurality of battery modules by the result of the detecting operation by said second means.

* * * * *